United States Patent
Shi et al.

(10) Patent No.: US 10,133,153 B2
(45) Date of Patent: Nov. 20, 2018

(54) SELF-DAMPING SHUTTER APPARATUS FOR EXPOSURE SYSTEM OF PHOTOLITHOGRAPHY MACHINE

(71) Applicant: SHANGHAI MICRO ELECTRONICS EQUIPMENT (GROUP) CO., LTD., Shanghai (CN)

(72) Inventors: Shuo Shi, Shanghai (CN); Hanchuan Ji, Shanghai (CN)

(73) Assignee: Shanghai Micro Electronics Equipment (Group) Co., Ltd., Shanghai (CN)

(*) Notice: Subject to any disclaimer, the term of this patent is extended or adjusted under 35 U.S.C. 154(b) by 0 days.

(21) Appl. No.: 15/540,917

(22) PCT Filed: Dec. 29, 2015

(86) PCT No.: PCT/CN2015/099386
§ 371 (c)(1),
(2) Date: Jun. 29, 2017

(87) PCT Pub. No.: WO2016/107543
PCT Pub. Date: Jul. 7, 2016

(65) Prior Publication Data
US 2017/0343883 A1    Nov. 30, 2017

(30) Foreign Application Priority Data

Dec. 31, 2014  (CN) .......................... 2014 1 0855707

(51) Int. Cl.
*G03B 9/14*      (2006.01)
*G03F 7/20*     (2006.01)
(Continued)

(52) U.S. Cl.
CPC ................. *G03B 9/08* (2013.01); *G03B 9/14* (2013.01); *G03F 7/20* (2013.01); *G03F 7/7015* (2013.01);
(Continued)

(58) Field of Classification Search
CPC .... G03B 9/00; G03B 9/14; G03F 7/20; G03F 7/70058; G03F 7/70066; G03F 7/7055
(Continued)

(56) References Cited

U.S. PATENT DOCUMENTS 5,053,934 A * 10/1991 Krebs ...................... F21S 8/00
                                                                   353/88
2007/0286056 A1* 12/2007 Ernst ...................... G11B 7/128
                                                                   369/176
2008/0204683 A1    8/2008 Van Buel

FOREIGN PATENT DOCUMENTS

CN            2521599 Y     11/2002
CN         102087476 A      6/2011
(Continued)

*Primary Examiner* — Colin Kreutzer
(74) *Attorney, Agent, or Firm* — Muncy, Geissler, Olds & Lowe, P.C.

(57) ABSTRACT

A self-damping shutter apparatus for use in an exposure system of a photolithography machine, comprising: at least two pieces of shutter blades (1) for cutting off light source to an exposure area when the shutter is closed; a shutter driving arm (2), for driving the shutter blades (1) to synchronically open or close; a magnetic damping brake motor (3), for driving or braking the shutter driving arm (2), and the magnetic damping brake motor (3) drives and brakes, via the shutter driving arm (2), the shutter blades (1). The self-damping shutter apparatus for use in the exposure system of the photolithography machine increases consistency of opening or closing the shutter blades, improves a light shading effect of the shutter apparatus in an exposure, and improves stability in the process of opening or closuring (Continued)

the shutter blades. When the shutter blades complete actions of opening or closing, current is not needed, the magnetic damping braking motor enables the shutter blades to maintain the state of opening or closing, shortens duration of control current, reduces heat dissipation, and saves energy.

9 Claims, 5 Drawing Sheets

(51) Int. Cl.
  *G03B 9/08* (2006.01)
  *H01L 21/027* (2006.01)
(52) U.S. Cl.
  CPC ........ *G03F 7/7055* (2013.01); *G03F 7/70058* (2013.01); *G03F 7/70066* (2013.01); *H01L 21/027* (2013.01)
(58) Field of Classification Search
  USPC ............................. 355/67, 71; 359/230–232
  See application file for complete search history.

(56) References Cited

FOREIGN PATENT DOCUMENTS

| | | | |
|---|---|---|---|
| JP | S565526 | A | 1/1981 |
| JP | H04317315 | A | 11/1992 |
| JP | H1187207 | A | 3/1999 |
| JP | H11233423 | A | 8/1999 |
| JP | 2008020844 | A | 1/2008 |

* cited by examiner

SELF-DAMPING SHUTTER APPARATUS FOR EXPOSURE SYSTEM OF PHOTOLITHOGRAPHY MACHINE

TECHNICAL FIELD

The present invention relates to the manufacturing of photolithography equipment and, more particular, to a self-damping shutter device for use in an exposure sub-system of a photolithography tool.

BACKGROUND

Photolithography is a technique for printing a pattern with features onto the surface of a substrate. A commonly-used substrate is a semiconductor wafer or a glass substrate which is surface-coated with a light-sensitive material. During a photolithography process, a wafer is placed on a wafer stage and the pattern with features is projected onto the surface thereof through an exposure device incorporated in the photolithography equipment.

Figure 1:
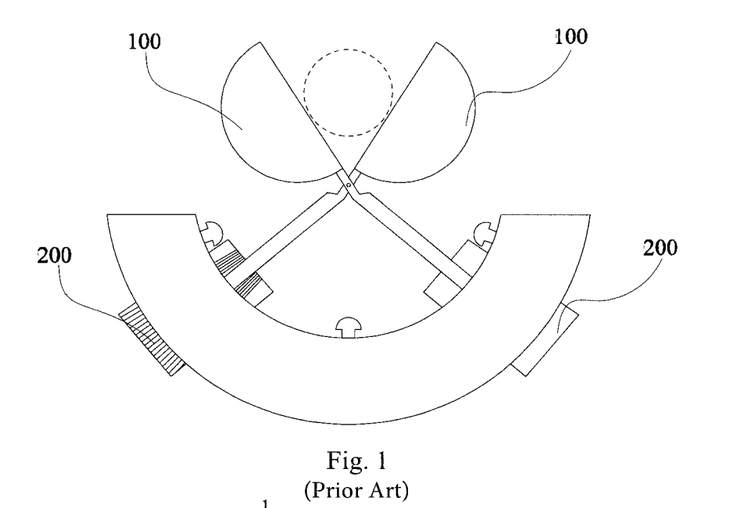
FIG. 1 is a structural schematic of a conventional shutter device.
Figure 4A:
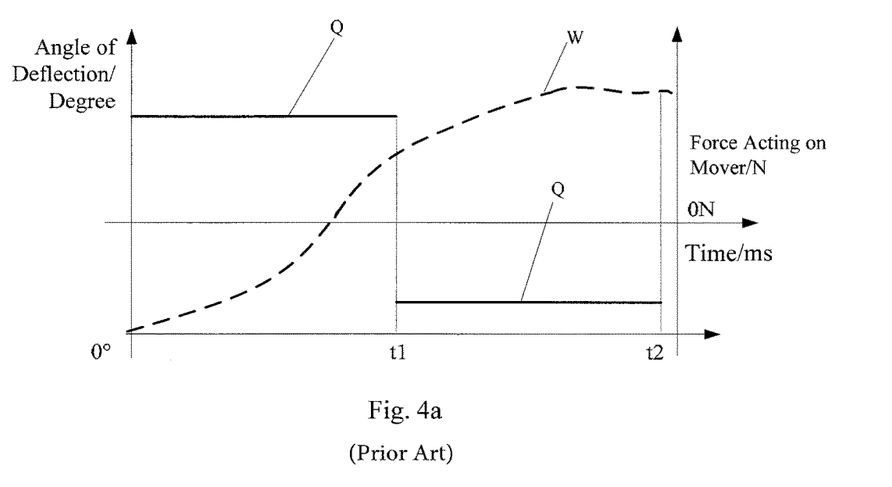
FIG. 4a is a diagram showing the evolution of an angle of deflection of conventional shutter blades over time during their movement.

Referring to FIG. 1, a conventional damping-free shutter device used in an exposure sub-system of a photolithography tool includes: at least two shutter blades 100 provided with respective voice coil motors 200 for driving the shutter blades 100 into an open or closed configuration. Motions of the shutter blades 100 toward the open or closed configuration as well as an extent to which they are opened or closed are controlled through adjusting currents flowing in mover coils of the voice coil motors 200. Referring to FIG. 4a, during operation of the damping-free shutter device, the mover coils in the voice coil motor 200 first accelerate for t/2 (i.e., 0-t1) under the effect of forward currents and then decelerate for t/2 (i.e., t1-t2) under the effect of reverse currents until their speeds decrease to zero. After the shutter blades 100 reach the open configuration, currents are further provided in order to keep them in the open configuration. In FIG. 4a, t1 denotes an instant of time when the conventional damping-free shutter device starts to be braked under the action of the reverse currents, t1-t2 indicates a period of time required for breaking of the conventional damping-free shutter device, Q represents a curve showing dependence of a Lorentz force acting on the mover coil in each of the conventional voice coil motors on time, and W indicates a curve illustrating evolution of an angle of deflection of each shutter blade 100 during its movement over time.

Therefore, the motions of the shutter blades 100 toward the open or closed configuration as well as the extent to which they are opened or closed are subject to an open-loop current control. The control side may interfere with the exposure process, and the open-loop current control may affect the stability of the shutter blades 100 during their acceleration and braking. Additionally, as the shutter blades 100 are separately controlled by the respective voice coil motors 200, there is a lack of consistency between their opening or closing processes, leading to insufficient repeatability of the shutter blade 100 and impaired exposure performance.

SUMMARY OF THE INVENTION

It is an object of the present invention to provide a self-damping shutter device for use in an exposure sub-system of a photolithography tool, which has improved opening or closing consistency between the shutter blades, reduced interference with the exposure process by the control side and enhanced exposure performance.

In order to achieve the above goal, the present invention provides a self-damping shutter device for use in an exposure system of a photolithography tool, comprising: at least two shutter blades, configured to shade a light for an exposure area when the at least two shutter blades are in a closed configuration; a shutter actuation arm, configured to drive the at least two shutter blades simultaneously into the closed configuration or an open configuration; and a magnetic damping braking motor, configured to drive or brake the shutter actuation arm such that the at least two shutter blades enter the open or the closed configuration simultaneously.

Preferably, the magnetic damping braking motor comprises a stator, a mover and a magnetic damping braking module. The mover is movable relative to the stator and the magnetic damping braking module. The mover is coupled to the shutter actuation arm via an actuation frame.

Preferably, the stator comprises a magnet, an iron core cap and an iron core. The magnet is coupled to both the iron core cap and the iron core.

Preferably, the mover comprises a coil bobbin on which a mover coil is wound. The coil bobbin has an axisymmetric structure. A first axially-magnetized damping magnet (3-71) and a second axially-magnetized damping magnet (3-72) are fixedly provided on each of an upper side and a lower side of a horizontal symmetric axis of the coil bobbin, the first axially-magnetized damping magnet and the second axially-magnetized damping magnet have a first normally-magnetized damping magnet and a second normally-magnetized damping magnet disposed therebetween.

Preferably, the first axially-magnetized damping magnets arranged on the upper and lower sides of the horizontal symmetric axis of the coil bobbin are magnetized in a same direction. The second axially-magnetized damping magnets arranged on the upper and lower sides of the horizontal symmetric axis of the coil bobbin are also magnetized in a same direction. The first axially-magnetized damping magnets and the second axially-magnetized damping magnets are magnetized in opposite directions.

Preferably, the magnetic damping braking module has an upper half and a lower half in symmetry with each other and comprises a first damping magnet and a second damping magnet that are oppositely magnetized. The first damping magnet is fixedly connected to the iron core via a first damping leaf spring. The second damping magnet is fixedly connected to a fixed frame disposed on the magnetic damping braking motor via a second damping leaf spring.

Preferably, the shutter actuation arm is a symmetric four-bar linkage mechanism having a first end hinged to the at least two shutter blades and a second end, which is symmetric to the first end hinged to an actuation frame, and the actuation frame is connected to the magnetic damping braking motor.

Preferably, the at least two shutter blades are of a sluice type.

Preferably, the at least two shutter blades are fabricated from hardened aluminum or ceramic sheets.

Preferably, the at least two shutter blades are surface-coated with a reflective material.

Compared to the prior art, the self-damping shutter device according to the present invention incorporates the shutter actuation arm and the magnetic damping braking motor which drives the shutter actuation arm such that the shutter blades are opened or closed at the same time. This results in improved opening or closing consistency between the shutter blades, good exposure repeatability and better shading of the exposure light. Additionally, the opening or closing process of the shutter blades is made not subject to an open-loop current control, immunizing motions of the shutter blades from an adverse impact by the control side and enhancing the stability of the opening or closing process of the shutter blades. Further, once the shutter blades have reached the completely open or closed configuration, the magnetic damping braking motor can keep them in the configuration by means of the shutter actuation arm without needing a current supply any more. This shortens the period of time required for current control, reduces dissipated heat and saves energy. Furthermore, the magnetic damping braking module brakes the opening or closing of the shutter blades by itself, with reduced consumption of time, stable motions of the shutter blades, no need for rubber damping rods and capabilities of excellent non-linear damping and rapid braking of the mover moving at a high speed, thus improving the braking of the shutter blades.

In the figures showing the prior art, 100 denotes shutter blades; and 200, a voice coil motor.

In the figures illustrating the present invention, 1 denotes shutter blades; 2, a shutter actuation arm; 3, a magnetic damping-braking motor; 301, a stator; 302, a mover; 303, a magnetic damping braking module; 3-2, a magnet; 3-3, an iron core cap; 3-4, an iron core; 3-5, a coil bobbin; 3-6, a mover coil; 3-71, a first axially-magnetized damping magnet; 3-72, a second axially-magnetized damping magnet; 3-81, a first normally-magnetized damping magnet; 3-82, a second normally-magnetized damping magnet; 3-9, a fixed frame; 3-101, a first damping magnet; 3-102, a second damping magnet; 3-111, a first damping leaf spring; 3-112, a second damping leaf spring; 4, an actuation frame;

M, first magnetic circuits; and N, second magnetic circuits.

DETAILED DESCRIPTION

The present invention will be described below in detail with reference to the accompanying drawings.

Figure 2A:
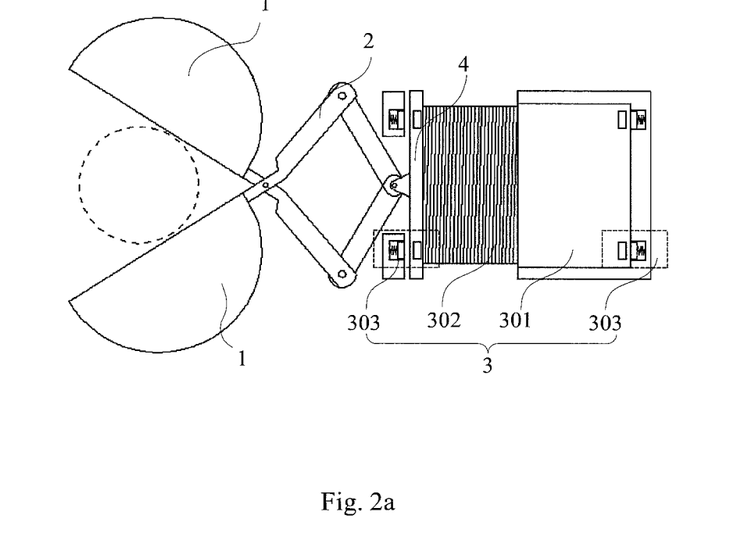
FIG. 2a is a structural schematic of shutter blades in an open configuration according to a specific embodiment of the present invention.
Figure 2B:
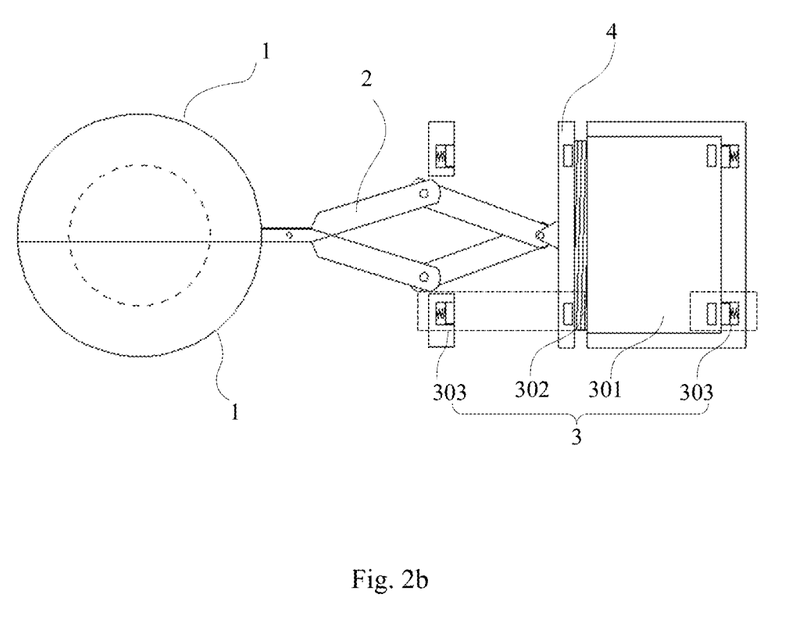
FIG. 2b is a structural schematic of shutter blades in a closed configuration according to a specific embodiment of the present invention.

Referring to FIGS. 2a and 2b, a self-damping shutter device for use in an exposure sub-system of a photolithography tool comprises: at least two shutter blades 1, configured to shade light bound to an exposure area when they are in a closed configuration; a shutter actuation arm 2, adapted to drive the shutter blades 1 into the closed configuration or an open configuration in a synchronized manner; and a magnetic damping braking motor 3, configured to drive or brake the shutter actuation arm 2. The magnetic damping braking motor 3 drives and brakes the shutter blades 1 through the shutter actuation arm 2. Although two shutter blades 1 are depicted in FIGS. 2a and 2b, those skilled in the art will appreciate that three, four or more shutter blades 1 may also be used as long as they can shade the light bound to the exposure area when in the closed configuration.

Figure 3A:
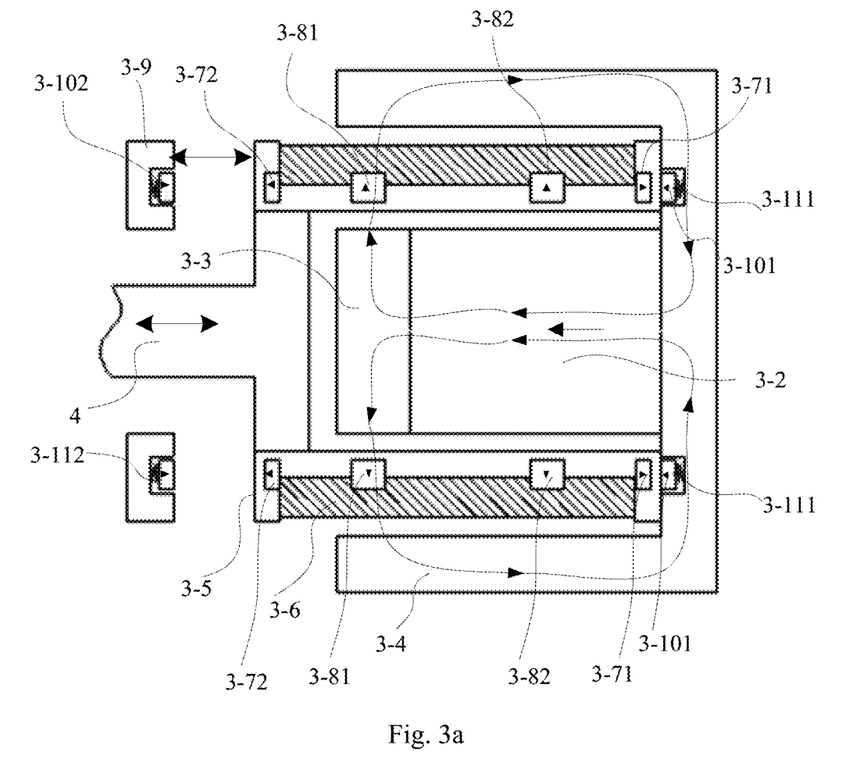
FIG. 3a is a structural schematic of a magnetic damping-braking motor according to a specific embodiment of the present invention.

Referring to FIGS. 2a, 2b and 3a, the magnetic damping braking motor 3 includes a stator 301, a mover 302 and a magnetic damping braking module 303. The mover 302 is movable relative to the stator 301 and to the magnetic damping braking module 303. The mover 302 is connected to the shutter actuation arm 2 via an actuation frame 4. The mover 302 drives the actuation frame 4 so that the moving actuation frame 4 in turn drives the shutter actuation arm 2 to make the shutter blades 1 move toward the open or closed configuration in a synchronized and braked manner.

Referring to FIGS. 2a, 2b and 3a, the stator 301 includes a magnet 3-2 that is connected, at one end, to an iron core cap 3-3 and, at the other end, to an iron core 3-4.

The magnet 3-2 is so assembled with the iron core 3-4 as to overall appear like a letter "E".

Referring to FIGS. 2a, 2b and 3a, the mover 302 includes a coil bobbin 3-5 over which a mover coil 3-6 is wound. The coil bobbin 3-5 is an axisymmetric structure. A first axially-magnetized damping magnet 3-71 and a second axially-magnetized damping magnet 3-72 are fixedly provided on each of an upper side and a lower side of a horizontal symmetric axis of the coil bobbin (3-5), between which a first normally-magnetized damping magnet 3-81 and a second normally-magnetized damping magnet 3-82 are disposed.

The first axially-magnetized damping magnets 3-71 arranged on the opposing sides of a horizontal axis of symmetry of the coil bobbin 3-5 are magnetized in the same direction. Similarly, the second magnetized damping magnets 3-72 on the opposing sides of the horizontal axis of symmetry of the coil bobbin 3-5 are also magnetized in the same direction. In addition, on each side of the horizontal axis of symmetry, the magnetization direction of the first axially-magnetized damping magnet 3-71 is opposite to that of the second axially-magnetized damping magnet 3-72.

Figure 3B:
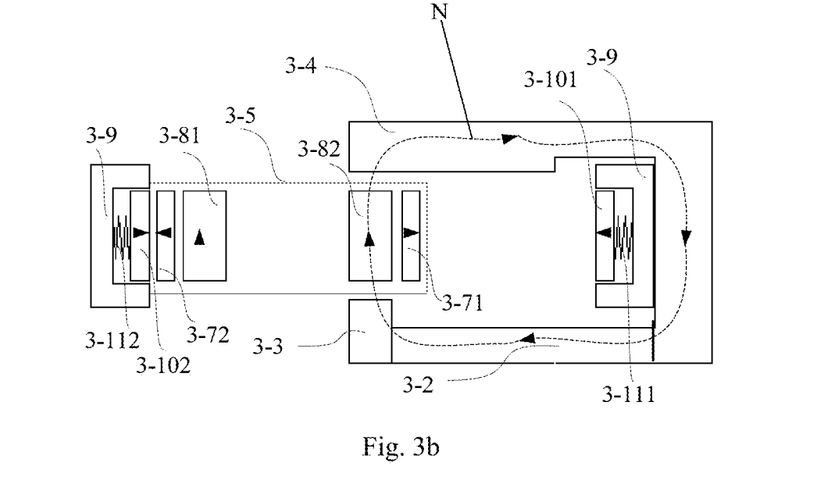
FIG. 3b is a structural schematic of open shutter blades in a self-damping shutter device according to a specific embodiment of the present invention.
Figure 3C:
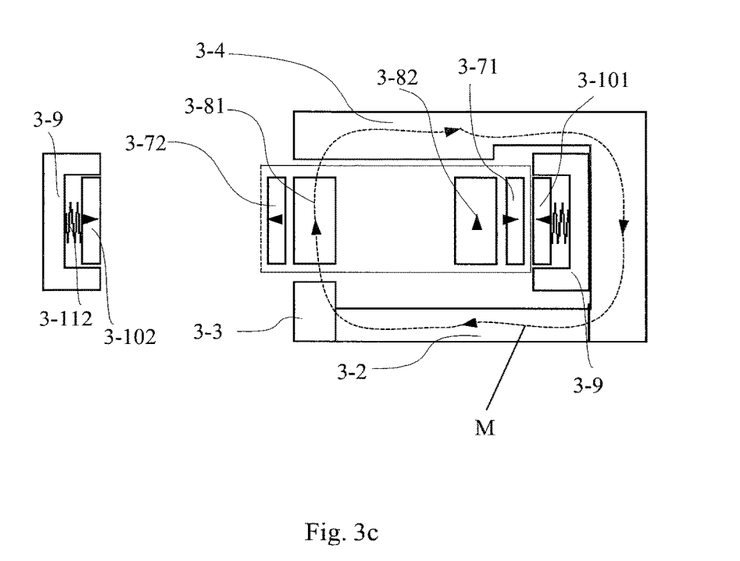
FIG. 3c is a structural schematic of closed shutter blades in a self-damping shutter device according to a specific embodiment of the present invention.

Referring to FIGS. 2a and 3c, an initial standby position of the mover 302 corresponds to the closed configuration of the shutter blades 1. At this position, the first normally-magnetized damping magnets 3-81, the iron core 3-4, the magnet 3-2 and the iron core cap 3-3 form two complete first magnetic circuits M which exert a magnetic force on the mover 302 and keep it stationary. In addition, the mover 302 pulls the shutter blades 1 via the shutter actuation arm 2 so that the shutter blades 1 are maintained in the closed configuration.

Referring to FIGS. 2b and 3b, an end point of movement of the mover 302 corresponds to the open configuration of the shutter blades 1. When a current is introduced into the mover coil 3-6, a Lorentz force is produced therefrom to drive the mover 302 to move axially relative to the stator 301. Consequently, the shutter blades 1 are opened with the aid of the shutter actuation arm 2. Upon the second normally-magnetized damping magnets 3-82 reaching locations above the iron core cap 3-3, the second normally-magnetized damping magnets 3-82, the iron core 3-4, the magnet 3-2 and the iron core cap 3-3 form two complete second magnetic circuits N which exert a capture force on the mover 302 so that the mover 302 is gradually braked. The braking process is described in detail below.

The coil bobbin 3-5 is disposed outside of the magnet 3-2 and within the iron core 3-4.

Referring to FIGS. 2a, 2b and 3a, the magnetic damping braking module 303 has an upper half and a lower half in symmetry with each other and includes a first damping magnet 3-101 and a second damping magnet 3-102 that are oppositely magnetized. The first damping magnet 3-101 is fixedly connected to the iron core 4 via a first damping leaf spring 3-111, and the second damping magnet 3-102 is fixedly connected to a fixed frame 3-9 disposed on the magnetic damping braking motor 3 via a second damping leaf spring 3-112.

Referring to FIGS. 2a and 2b, the shutter actuation arm 2 is a symmetric four-bar linkage mechanism having an end hinged to the shutter blades 1 and another end symmetric thereto hinged to the actuation frame 4. The actuation frame 4 is connected to the magnetic damping braking motor 3.

Use of the four-bar linkage mechanism enables synchronized actuation of the two shutter blades 1 with the single magnetic damping braking motor 3, enhancing movement consistency between the two shutter blades 1 and increasing exposure repeatability.

The shutter blades 1 are of the sluice type in order to facilitate synchronized actuation of the two shutter blades 1 through the magnetic damping braking motor 3.

Actuation of both the two shutter blades 1 with the single magnetic damping braking motor 3 with the aid of the shutter actuation arm 2 improves the opening and closing consistency between these two shutter blades 1, in particular a sluice-type shutter blades 1, while achieving good exposure repeatability and enhancing shading of the exposure light by the shutter device.

The shutter blades 1 are fabricated from hardened aluminum or ceramic sheets and can withstand a maximum operating temperature of 300° C.

The shutter blades 1 are surface-coated with a reflective material. In the closed configuration of the shutter blades 1, the reflective material can reflect away most of incident light from an exposure light source. As a result, heat absorbance of the shutter blades 1 is reduced, which is conducive to the normal operation of the shutter blades 1.

Referring to FIGS. 2a, 2b and 3a to 3c, when the shutter blades 1 are in the closed configuration, the mover 302 is at the initial position, and the first normally-magnetized damping magnets 3-81, the iron core 3-4, the magnet 3-2 and the iron core cap 3-3 form two complete first magnetic circuits M which exert a magnetic force on the mover 302 and keep it stationary. The mover 302 pulls the shutter blades 1 via the shutter actuation arm 2 so that the shutter blades 1 are maintained in the closed configuration. At this point, there is a repulsive force between the first axially-magnetized damping magnet 3-71 and the first damping magnet 3-101, so that the first damping leaf spring 3-111 is compressed and stores elastic potential energy. While the repulsive force has a certain urging effect on the mover 302, as it is less than the magnetic force exerted thereon by the first magnetic circuits M, the mover 302 remains stationary.

Upon application of a current into the mover coil 3-6, a Lorentz force is generated therefrom which drives the mover 302 to axially move relative to the stator 301. As a result, the mover 302 gradually goes away from the iron core 3-4, and the distance between the first axially-magnetized damping magnet 3-71 and the first damping magnet 3-101 gradually increases. This results in a reduction in the repulsive force as well as release of magnetic energy. In addition, the first damping leaf spring 3-111 is gradually decompressed, releasing the elastic potential energy. The released magnetic energy and elastic potential energy together power the mover 302 to accelerate axially, which in turn drives, via the shutter actuation arm 2, the two shutter blades 1 to gradually move toward the open configuration simultaneously.

Figure 4B:
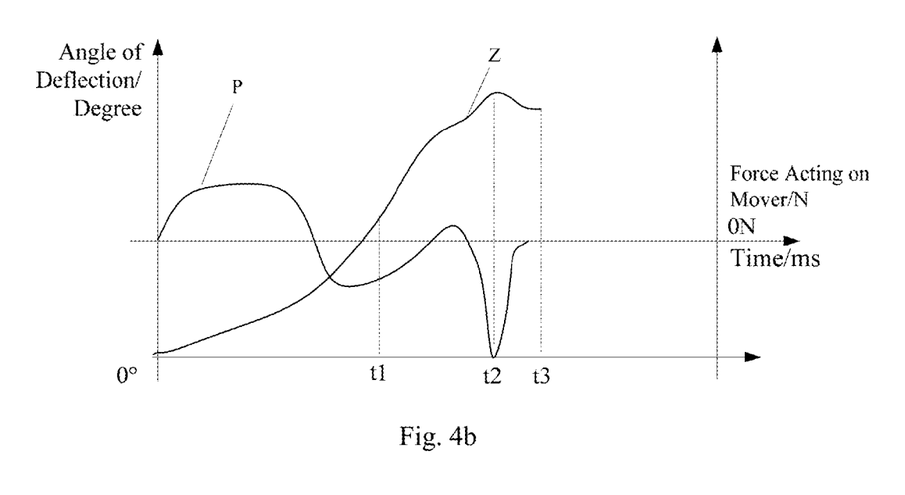
FIG. 4b is a diagram showing the evolution of an angle of deflection of shutter blades according to a specific embodiment of the present invention over time during their movement.

When the mover 302 is accelerated by the Lorentz force to an intermediate position, referring to FIG. 4b, at the instant t1, the mover coil 3-6 is controlled to be short-circuited or disconnected, leaving the mover coil 3-6 subject to a damping force generated from its own reverse holding current or not subject to any force. Consequently, the mover 302 starts to be braked and decelerated.

Upon the mover 302 decelerating to a position where the second normally-magnetized damping magnet 3-8 is located above the iron core cap 3-3, the second normally-magnetized damping magnet 3-82, the iron core 3-4, the magnet 3-2 and the iron core cap 3-3 form two complete second magnetic circuits N which exert a magnetic force on the mover 302, making the mover 302 continue the axial movement. With this axial movement proceeding, the second normally-magnetized damping magnet 3-82 gradually goes away from the magnet 3-2 and the magnetic force exerted on the mover 302 by the second magnetic circuits N decreases.

With the mover 302 further moving axially, a magnetic force is created between the second damping magnet 3-102 and the second axially-magnetized damping magnet 3-72 and increases with the second damping magnet 3-102 approaching the second axially-magnetized damping magnet 3-72. This magnetic force has a braking effect on the mover 302 and may be referred to as a damping braking force. The damping braking force gradually neutralizes the magnetic force exerted by the second magnetic circuits N on the mover 302. As a result, after slight vibration of the mover 302, part of energy of the mover 302 is rapidly converted through the short-circuited mover coil 3-6 into heat that is subsequently dissipated, another part thereof is converted into magnetic energy between the second damping magnet 3-102 and the second axially-magnetized damping magnet 3-72, and still another part thereof is converted into elastic potential energy of the second damping leaf spring 3-112. Under the action of the damping braking force, the mover 302 is gradually stopped and drives, with the aid of the shutter actuation arm 2, the shutter blades 1 simultaneously into the completely open configuration. As such, the braking of the shutter actuation arm 2 by the magnetic damping braking motor is accomplished. The magnetic energy between the second damping magnet 3-102 and the second axially-magnetized damping magnet 3-72 and the elastic potential energy of the second damping leaf spring 3-112 enable the shutter blades 1 to be kept in the open configuration and can serve as an energy source for initializing the closing of the shutter blades 1.

Referring to FIG. 4b, t1 denotes the instant when the magnetically damped shutter device of the present invention starts the braking through short-circuiting, t1-t3 indicates a period of time required for breaking of the magnetically damped shutter device, P represents a curve showing dependence of a magnetic damping force acting on the mover 302 on time, and Z indicates a curve illustrating evolution of an angle of deflection of the shutter blades 1 during their movement over time. In the magnetically damped shutter device of the present invention, during the process of the shutter blades 1 shifting from the closed configuration to the completely open configuration, the angular position of the shutter blades 1 during their opening or closing is dependent on a combination of the Lorentz force from the mover coil 3-6 and the magnetic damping forces exerted by the first magnetic circuits M and the second magnetic circuits N. During operation, a current is first applied to drive the mover 302 to accelerate to a maximum speed and then cut off at the instant t1 when the mover 302 is approaching the end point of its movement. Therefore, the magnetic damping braking motor 3 can accomplish the braking of the mover 302 without requiring a reverse current to decelerate the mover 302. Compared to the conventional damping-free shutter device, this theoretically allows a 20% reduction in the movement time of the mover 302 at the same acceleration and driving force conditions. From a comparison between the curves W and Z, it can be found that the opening or closing speed of the shutter blades 1 is increased according to the present invention because they manage the completely open configuration early at the instant t2 and then maintain the configuration. In contrast, according to the curve Z of the conventional device, the shutter blades are completely open at the instant t3. Therefore, the magnetic damping braking motor 3 increases the opening or closing speed of the shutter blades 1. Additionally, the opening or closing process of the shutter blades 1 is made not subject to an open-loop current control. This immunizes motions of the shutter blades 1 from an adverse impact by the control side and enhances the stability of the opening or closing process of the shutter blades 1. Further, the magnetic damping braking module 303 brakes the opening or closing of the shutter blades 1 by itself, with reduced consumption of time, stable motions of the shutter blades, stable position limitations during the movement, no need for rubber damping rods and capabilities of excellent non-linear damping and rapid braking of the mover 302 moving at a high speed. Furthermore, once the shutter blades 1 have reached the completely open or closed configuration, the magnetic damping braking motor 3 can keep them in the configuration without needing a current supply any more. This shortens the period of time required for current control, reduces dissipated heat, saves energy, mitigates the adverse influence of the control side on motions of the shutter blades 1 and enhances the braking of the shutter blades 1.

Various modifications and variations can be made to the present invention by those skilled in the art without departing from the spirit and scope thereof. Accordingly, it is intended that the present invention also includes such modifications and variations if they fall within the scope of the appended claims and the equivalents thereof.

What is claimed is:

1. A self-damping shutter device for use in an exposure system of a photolithography tool, comprising:
   at least two shutter blades (1), configured to shade a light for an exposure area when the at least two shutter blades are in a closed configuration;
   a shutter actuation arm (2), configured to drive the at least two shutter blades (1) simultaneously into the closed configuration or an open configuration; and
   a magnetic damping braking motor (3), configured to drive or brake the shutter actuation arm (2) such that the at least two shutter blades (1) enter the open or the closed configuration simultaneously,
   wherein the magnetic damping braking motor (3) comprises a stator (301), a mover (302) and a magnetic damping braking module (303), the mover (302) movable relative to the stator (301) and the magnetic damping braking module (303), the mover (302) coupled to the shutter actuation arm (2) via an actuation frame (4).

2. The self-damping shutter device according to claim 1, wherein the stator (301) comprises a magnet (3-2), an iron core cap (3-3) and an iron core (3-4), the magnet (3-2) coupled to the iron core cap (3-3) and the iron core (3-4).

3. The self-damping shutter device according to claim 1, wherein the mover (302) comprises a coil bobbin (3-5) on which a mover coil (3-6) is wound, wherein the coil bobbin (3-5) has an axisymmetric structure, and wherein a first axially-magnetized damping magnet (3-71) and a second axially-magnetized damping magnet (3-72) are fixedly provided on each of an upper side and a lower side of a horizontal symmetric axis of the coil bobbin (3-5), and wherein the first axially-magnetized damping magnet (3-71) and the second axially-magnetized damping magnet (3-72) have a first normally-magnetized damping magnet (3-81) and a second normally-magnetized damping magnet (3-82) disposed therebetween.

4. The self-damping shutter device according to claim 3, wherein the first axially-magnetized damping magnets (3-71) arranged on the upper and lower sides of the horizontal symmetric axis of the coil bobbin (3-5) are magnetized in a same direction, wherein the second axially-magnetized damping magnets (3-72) arranged on the upper and lower sides of the horizontal symmetric axis of the coil bobbin (3-5) are magnetized in a same direction; and wherein the first axially-magnetized damping magnets (3-71) and the second axially-magnetized damping magnets (3-72) are magnetized in opposite directions.

5. The self-damping shutter device according to claim 2, wherein the magnetic damping braking module (303) has an upper half and a lower half in symmetry with each other and comprises a first damping magnet (3-101) and a second damping magnet (3-102) that are oppositely magnetized, wherein the first damping magnet (3-101) is fixedly connected to the iron core (3-4) via a first damping leaf spring (3-111), and wherein the second damping magnet (3-102) is fixedly connected to a fixed frame (3-9) disposed on the magnetic damping braking motor (3) via a second damping leaf spring (3-112).

6. The self-damping shutter device according to claim 1, wherein the shutter actuation arm (2) is a symmetric four-bar linkage mechanism having a first end hinged to the at least two shutter blades (1) and a second end, which is symmetric to the first end, hinged to the actuation frame (4), and
   wherein the actuation frame (4) is connected to the magnetic damping braking motor (3).

7. The self-damping shutter device according to claim 1, wherein the at least two shutter blades (1) are of a sluice type.

8. The self-damping shutter device according to claim 1, wherein the at least two shutter blades (1) are fabricated from hardened aluminum or ceramic sheets.

9. The self-damping shutter device according to claim 1, wherein the at least two shutter blades (1) are surface-coated with a reflective material.

* * * * *